United States Patent
Tsai et al.

(10) Patent No.: US 12,408,459 B2
(45) Date of Patent: Sep. 2, 2025

(54) IMAGE SENSOR HAVING LIQUID-LENS UNITS AND METHOD FOR DETECTING IMAGES

(71) Applicant: VisEra Technologies Company Limited, Hsin-Chu (TW)

(72) Inventors: Wei-Lung Tsai, Hsin-Chu (TW); Huang-Jen Chen, Hsin-Chu (TW); Ching-Chiang Wu, Hsin-Chu (TW); Yu-Chi Chang, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 495 days.

(21) Appl. No.: 17/538,354

(22) Filed: Nov. 30, 2021

(65) Prior Publication Data

US 2023/0170368 A1    Jun. 1, 2023

(51) Int. Cl.
  *H10F 39/00*    (2025.01)
  *G02B 3/12*    (2006.01)
  (Continued)

(52) U.S. Cl.
  CPC .......... *H10F 39/8063* (2025.01); *G02B 3/12* (2013.01); *G02B 3/14* (2013.01); *G02F 1/1343* (2013.01);
  (Continued)

(58) Field of Classification Search
  CPC ......... H01L 27/14627; H01L 27/14621; H01L 27/1463; H01L 27/14645; H01L 27/14625;
  (Continued)

(56) References Cited

U.S. PATENT DOCUMENTS 6,577,775 B1 * 6/2003 Li .............................. G06T 5/90
                                                                 382/274
7,978,400 B2 * 7/2011 Takemoto ............ G11B 7/1374
                                                                 369/112.02
(Continued)

FOREIGN PATENT DOCUMENTS

CN    107180411 A  *  9/2017  ........... G06T 3/4053
JP    2006-203011      8/2006
(Continued)

OTHER PUBLICATIONS

Japanese Office Action of corresponding JP application No. 2022-076970 issued on Aug. 1, 2023 with English translation, 11 pages.
(Continued)

*Primary Examiner* — Georgia Y Epps
*Assistant Examiner* — Erin R Garber
(74) *Attorney, Agent, or Firm* — MUNCY, GEISSLER, OLDS & LOWE, P.C.

(57) ABSTRACT

An image sensor includes a plurality of liquid-lens units, which include: a lower electrode and an upper electrode; a dielectric layer disposed between the lower electrode and the upper electrode; a containment space disposed between the dielectric layer and the upper electrode; and a non-polar liquid and a polar liquid filled into the containment space, wherein the non-polar liquid and the polar liquid are immiscible with each other. The non-polar liquid is configured to occupy a first contact area on the dielectric layer under a first voltage, and a second contact area on the dielectric layer under a second voltage. The first contact area is larger than the second contact area, and the second voltage is higher than the first voltage.

18 Claims, 10 Drawing Sheets

(51) Int. Cl.
  *G02B 3/14* (2006.01)
  *G02F 1/1343* (2006.01)
  *G06T 5/50* (2006.01)
  *H10F 39/18* (2025.01)
(52) U.S. Cl.
  CPC ............ *G06T 5/50* (2013.01); *H10F 39/182* (2025.01); *H10F 39/8053* (2025.01); *H10F 39/806* (2025.01); *H10F 39/807* (2025.01)
(58) Field of Classification Search
  CPC ........... G02B 3/12; G02B 3/14; G02F 1/1343; G06T 5/50; H10F 39/8063; H10F 39/8053; H10F 39/807; H10F 39/182; H10F 39/806
  See application file for complete search history.

(56) References Cited

U.S. PATENT DOCUMENTS

| | | | | |
|---|---|---|---|---|
| 8,059,328 | B1 * | 11/2011 | Kuo | ............... G02B 26/005 359/290 |
| 9,064,315 | B2 * | 6/2015 | Meyers | .................. G06T 5/90 |
| 2001/0017985 | A1 | 8/2001 | Tsuboi et al. | |
| 2007/0206291 | A1 | 9/2007 | Kuiper et al. | |
| 2008/0310031 | A1 * | 12/2008 | Mohr | ............... G02B 26/0883 359/666 |
| 2009/0169806 | A1 | 7/2009 | Lo et al. | |
| 2012/0113525 | A1 | 5/2012 | Kong et al. | |
| 2015/0368413 | A1 * | 12/2015 | Tatemichi | .............. H01G 4/206 359/290 |
| 2018/0318067 | A1 * | 11/2018 | Otts | ....................... A61L 31/088 |
| 2019/0187455 | A1 | 6/2019 | Iwasaki | |
| 2021/0143206 | A1 | 5/2021 | Kim | |
| 2021/0183929 | A1 * | 6/2021 | Park | .................. H01L 27/14627 |
| 2022/0187509 | A1 * | 6/2022 | Taveniku | .............. H04N 23/676 |
| 2023/0097869 | A1 * | 3/2023 | Lin | ........................ G06V 20/00 382/156 |

FOREIGN PATENT DOCUMENTS

| | | | | |
|---|---|---|---|---|
| JP | 2006-235476 | | 9/2006 | |
| JP | 2007-158825 | | 6/2007 | |
| JP | 2021-103768 | | 6/2007 | |
| JP | 2012128029 A | * | 7/2012 | |
| KR | 10-2006-0016508 | | 2/2006 | |
| KR | 10-1227544 | | 1/2013 | |
| TW | 201232048 A | * | 8/2012 | ............. B23F 23/04 |
| TW | 201232048 A1 | | 8/2012 | |
| WO | WO2012/043212 | | 4/2012 | |
| WO | WO2017/221722 | | 12/2017 | |

OTHER PUBLICATIONS

Korean Office Action of corresponding KR application No. 10-2022-0033599 issued on Aug. 10, 2023 with English translation, 12 pages.

\* cited by examiner

IMAGE SENSOR HAVING LIQUID-LENS UNITS AND METHOD FOR DETECTING IMAGES

BACKGROUND

Technical Field

The present disclosure is related to an image sensor, and in particular it is related to the dynamic liquid-lens units of an image sensor and a method for detecting images.

Description of the Related Art

Image sensors, such as complementary metal oxide semiconductor (CMOS) image sensors (also known as CIS), are widely used in various image-capturing apparatuses such as digital still-image cameras, digital video cameras, and the like. The light sensing portion of an image sensor may detect ambient color changes, and signal electric charges may be generated depending on the amount of light received in the light sensing portion. In addition, the signal electric charges generated in the light sensing portion may be transmitted and amplified, thereby obtaining an image signal.

Since the image signal depends largely on light reception, operating an image sensor in a dark environment, or an environment of low luminance, may severely affect the quality of the resulting images. The severe effects include ghosting, noise, and motion blur. Even though a flash light may be used to increase the exposure during image detection, an apparatus required for lighting may increase the manufacturing cost. Therefore, these and related issues need to be addressed through the design and manufacture of image sensors.

SUMMARY

In an embodiment, an image sensor includes a plurality of liquid-lens units, which include: a lower electrode and an upper electrode; a dielectric layer disposed between the lower electrode and the upper electrode; a containment space disposed between the dielectric layer and the upper electrode; and a non-polar liquid and a polar liquid filled into the containment space, wherein the non-polar liquid and the polar liquid are immiscible with each other. The non-polar liquid is configured to occupy a first contact area on the dielectric layer under a first voltage, and a second contact area on the dielectric layer under a second voltage. The first contact area is larger than the second contact area, and the second voltage is higher than the first voltage.

In another embodiment, a method for detecting images from the image sensor includes: connecting the lower electrode and the upper electrode to a power source; supplying the first voltage from the power source to the image sensor through the lower electrode and the upper electrode to generate a first image; supplying the second voltage from the power source to the image sensor through the lower electrode and the upper electrode to generate a second image; and combining the first image and the second image into a final image using an algorithm.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
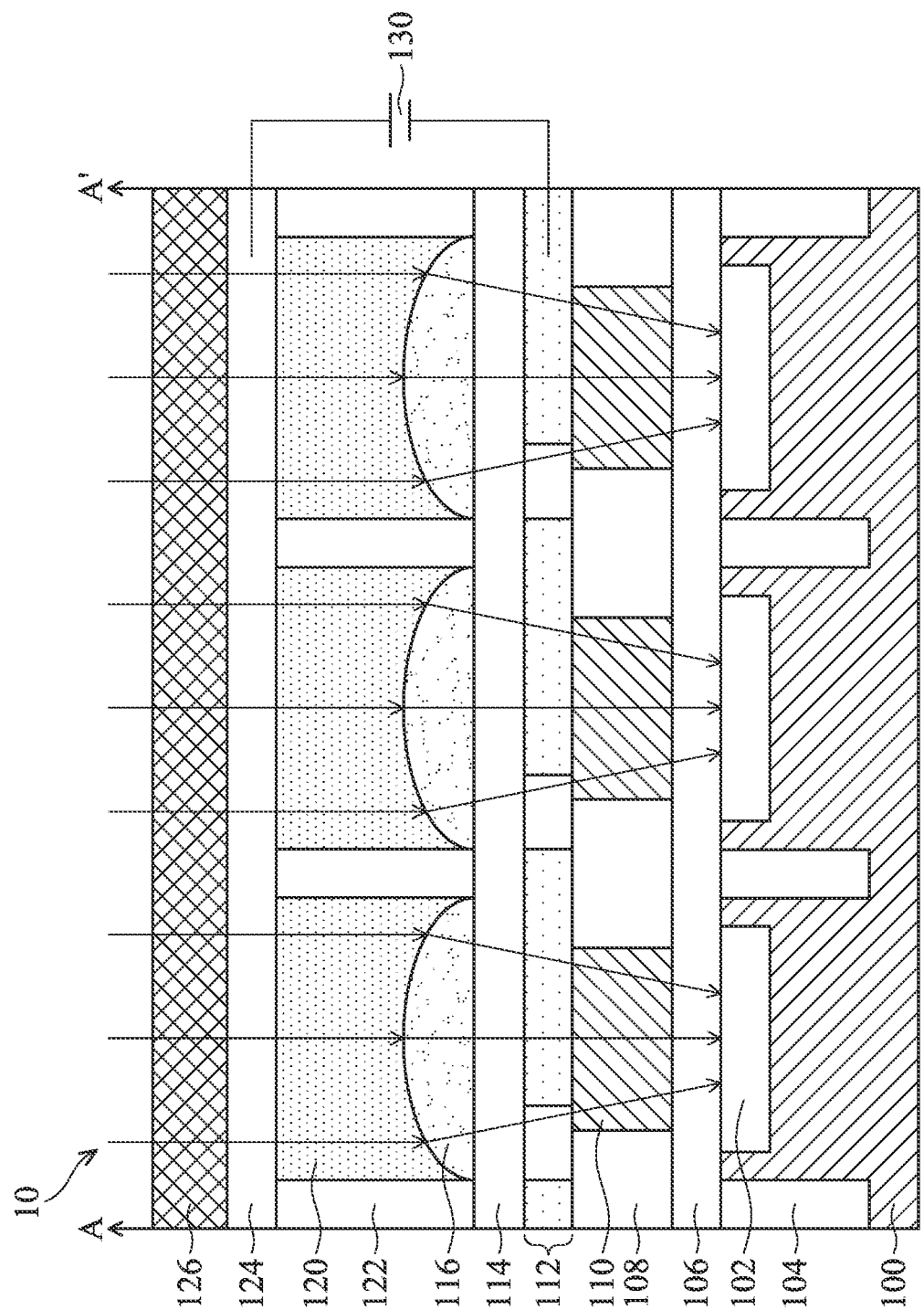
FIGS. 1A and 1B are respectively a cross-sectional view and a top view of an image sensor under a first operation state, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In response to operating an image sensor in an environment of low luminance, the quality of obtained images is of critical concern. A conventional method of enhancing the image quality is to expose the object using light from a flash. However, including an apparatus that provides a flash light increases the manufacturing cost. According to some embodiments of the present disclosure, a plurality of liquid-lens units are integrated into the image sensor. Conventionally, micro-lenses are fixed-shape solid for converging incident light rays through the underlying color filter units, and onto a plurality of sensing portions embedded within a substrate. In other words, by replacing the solid micro-lenses, the image sensor becomes a versatile structure. The dynamic liquid-lens may alter its shape in response to the application of different voltage levels. For example, when a power source supplies a voltage above 15V, the dynamic liquid-lens may change from a dispersed state to a concentrated state, the mechanism of which will be explained in detail later. When the dynamic liquid-lens is in the dispersed state, the image sensor may function similar to any typical image sensor structure. However, when the dynamic liquid-lens is in the concentrated state, more incident light may be allowed to enter the image sensor for image detection.

When operating in an environment of high luminance, the image sensor may detect images with relatively high quality under a sufficient amount of lighting. The present disclosure provides an innovative way of acquiring an image in the environment of low luminance, in which the image can possess the same quality as the one obtained in the environment of high luminance. The plurality of liquid-lens units of the present disclosure may enhance the quality of the captured image by adjusting the voltage, thereby increasing the image quality. Therefore, even without a flash light, the image sensor may operate as efficiently in the environment of low luminance as in the environment of high luminance. Since the operation of the image sensor already requires a power supply, supplying additional voltage to the plurality of liquid-lens units will not add any manufacturing cost.

FIG. 1A is a cross-sectional view of an image sensor 10 under a first operation state, according to some embodiments of the present disclosure. In some embodiments, image sensors may contain millions of sensor units in reality. For the sake of brevity, FIG. 1A only displays a portion of an actual image sensor. According to some embodiments of the present disclosure, the image sensor 10 includes a substrate 100, a plurality of sensing portions 102, a plurality of deep trench isolation (DTI) structures 104, an anti-reflection layer 106, a spacer structure 108, a plurality of color filter units 110, and a plurality of liquid-lens units. In the present embodiment, the plurality of liquid-lens units are disposed correspondingly above the plurality of color filter units 110, respectively. Moreover, the plurality of color filter units 110 are disposed correspondingly to the plurality of sensing portions 102, respectively. In some embodiments, the plurality of liquid-lens units include a lower electrode 112, a dielectric layer 114, non-polar liquid 116, polar liquid 120, a pixel wall 122, an upper electrode 124, and a cover plate 126. According to some embodiments of the present disclosure, a power source 130 is connected to the lower electrode 112 and the upper electrode 124 for supplying the necessary voltage. Under the first operation state, voltage in a range between about 0V and 15V is applied by the power source 130.

In some embodiments, the dielectric layer 114 is made of non-conductive dielectric materials, which is hydrophobic. When the non-polar liquid 116 and the polar liquid 120 are disposed on the dielectric layer 114 of hydrophobic nature, the polar liquid 120 may be repelled by the dielectric layer 114, while the non-polar liquid 116 may be attracted by the dielectric layer 114. As shown in FIG. 1A, the non-polar liquid 116 completely covers the surface of the dielectric layer 114, such that the dielectric layer 114 and the polar liquid 120 are substantially isolated by the non-polar liquid 116. When the power source 130 supplies no voltage (0V) or relatively low voltage (for example, lower than 15V), the arrangement of the plurality of liquid units may remain as illustrated in FIG. 1A.

Figure 2A:
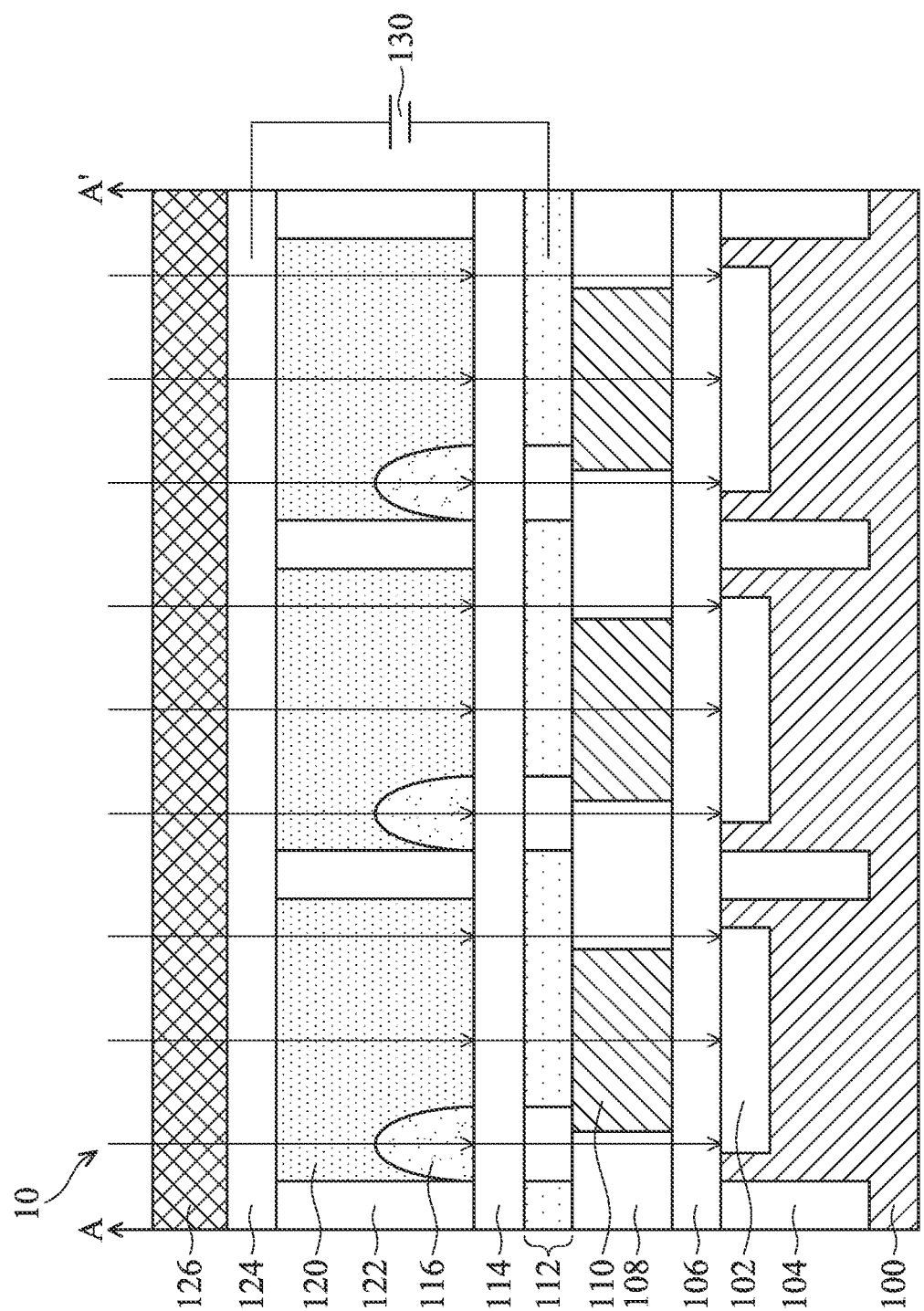
FIGS. 2A and 2B are respectively a cross-sectional view and a top view of the image sensor under a second operation state, according to some embodiments of the present disclosure.

However, when the power source 130 supplies a relatively high voltage (for example, higher than 15V), positive charges and negative charges may be arranged onto an upper surface and the lower surface of the dielectric layer 114, respectively. An electric field is generated when such voltage is applied, converting the dielectric layer 114 from a hydrophobic state to a hydrophilic state. As shown in FIG. 2A, the dielectric layer 114 begins to attract the polar liquid 120, and to repel the non-polar liquid 116. The wettability of the surface of the dielectric layer 114 is modified by the electric field, and this phenomenon is referred as an electrowetting behavior. The electrowetting devices are typically utilized in reflective displays. The inventor has discovered that integrating a dynamic liquid-lens that exhibits electrowetting behavior into the image sensor 10 may enable more superior performance in the environment of low luminance.

In some embodiments, the substrate 100 may be, for example, a wafer or a chip, but the present disclosure is not limited thereto. In some embodiments, the substrate 100 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof. In some embodiments, the substrate 100 may be a photoelectric conversion substrate, such as a silicon substrate or an organic photoelectric conversion layer.

In other embodiments, the substrate 100 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 100 may be an N-type or a P-type conductive type.

As mentioned above, the substrate 100 may include a plurality of deep trench isolation structures 104 to define active regions (or sensor units), and to electrically isolate active region elements within or above the substrate 100, but the present disclosure is not limited thereto. In some embodiments, other isolation structures may be applied as an alternative. Shallow trench isolation (STI) structures and local oxidation of silicon (LOCOS) structures are examples of other isolation structures. In some embodiments, the formation of the plurality of deep trench isolation structures 104 may include, for example, forming an insulating layer on the substrate 100, selectively etching the insulating layer and the substrate 100 to form trenches that extend from a top surface of the substrate 100 to a position within the substrate 100, in which the trenches are located between adjacent sensing portions 102. Next, the formation of the plurality of deep trench isolation structures 104 may include growing rich nitrogen-containing (such as silicon oxynitride) liners along the trenches, followed by filling insulating materials (such as silicon dioxide, silicon nitride, or silicon oxynitride) into the trenches with deposition processes. After that, an annealing process is performed on the insulating materials in the trenches, followed by a planarization process on the substrate 100 to remove excessive insulating materials, so the insulating materials in the trenches are level with the top surface of the substrate 100.

In some embodiments, the substrate 100 may include various P-type doped regions and/or N-type doped regions (not shown) formed by, for example, an ion implantation and/or diffusion process. In some embodiments, transistors, photodiodes, or the like, may be formed at the active regions, defined by the plurality of deep trench isolation structures 104.

The plurality of sensing portions 102 are embedded in the substrate 100. In some embodiments, the plurality of sensing portions 102 are photodiodes. Each of the plurality of sensing portions 102 is configured to sense light and generate an intensity signal according to the intensity of the light falling thereon. The image signal is formed by the intensity signals.

The anti-reflection layer 106 is disposed on the substrate 100. In some embodiments, the anti-reflection layer 106 is configured to decrease the reflection of the light being transmitted to the plurality of sensing portions 102. In some embodiments, the anti-reflection layer 106 is disposed horizontally in correspondence (or parallel with respect) to the array of sensing portions 102. In some embodiments, the materials of the anti-reflection layer 106 may include $SiO_xN_y$ (wherein x and y are in the range of 0 to 1). The anti-reflection layer 106 may be formed by any suitable deposition processes.

In some embodiments, the plurality of color filter units 110 are disposed on the anti-reflection layer 106 and the substrate 100, and corresponding to the array of sensing portions 102. In some embodiments, the height of the plurality of color filter units 110 may be approximately between about 0.3 µm and 2.0 µm. In some embodiments, the plurality of color filter units 110 may be colored red, green, blue, white, or infrared. Each of the plurality of color filter units 110 may correspond to each respective sensing portion 102 of the image sensor 10, and the color of the unit depends on the requirement of the image sensor 10. The respective sensing portions 102, such as photodiodes, may convert received light signals into electric signals. According to some embodiments of the present disclosure, the plurality of color filter units 110 is deposited on the substrate 100 and in the space defined by spacer structure 108, which will be explained in detail later. The plurality of color filter units 110 may be formed in sequence by a coating, exposure, and development process at different steps. Alternatively, the plurality of color filter units 110 may be formed by ink-jet printing.

In some embodiments, each of the plurality of color filter units 110 allows a predetermined range of wavelengths of light to pass through. For example, the red color filter units allow wavelengths of light in a range from 620 nm to 750 nm (red light) to transmit to the corresponding sensing portions 102, the green color filter units allow wavelengths of light in a range from 495 nm to 570 nm (green light) to transmit to the corresponding sensing portions 102, and the blue color filter units allow wavelengths of light in a range from 450 nm to 495 nm (blue light) to transmit to the corresponding sensing portions 102.

Refer to FIG. 1A. The spacer structure 108 is disposed between the plurality of color filter units 110. In some embodiments, the spacer structure 108 is connected to and surrounds each of the plurality of color filter units 110. Moreover, the spacer structure 108 is disposed on the anti-reflection layer 106 and the substrate 100, and exposes the areas directly above or compartmentalizes the array of sensing portions 102. According to some embodiments of the present disclosure, the spacer structure 108 may have a lower refractive index than the plurality of color filter units 110. The refractive index is a characteristic of a substance that changes the speed of light, and is a value obtained by dividing the speed of light in vacuum by the speed of light in the substance. When light travels between two different materials at an angle, its refractive index determines the angle of light transmission (refraction). According to some embodiments of the present disclosure, the refractive index of the spacer structure 108 is approximately between about 1.0 and about 1.5, while the refractive index of the plurality of color filter units 110 is between about 1.3 and about 2.0. Since lights tend to direct toward medium with higher refractive index, the plurality of color filter units 110 and the spacer structure 108 may form a light pipe structure to guide lights to the plurality of sensing portions 102. In other words, when incident light rays enter the plurality of color filter units 110, the spacer structure 108 may isolate the incident light rays within a specific color filter unit 110 to serve as the light-trapping function.

The material of the spacer structure 108 may include a transparent dielectric material. At first, a partition material layer is coated on the substrate 100. Next, a hard mask layer (not shown) is coated on the partition material layer. In some embodiments, the material of the hard mask layer is a photoresist. A photolithography process is performed on the hard mask layer for patterning. Next, an etching process is performed on the partition material layer by using the patterned hard mask layer. The etching process may be dry etching. After the etching process, a portion of the partition material layer is removed on the substrate 100, and multiple openings are formed therein. As mentioned previously, the openings will subsequently be filled with the plurality of color filter units 110.

Upon completing the plurality of color filter units 110, the plurality of liquid-lens units can be fabricated thereon. At first, the lower electrode 112 is formed on the top surface of the spacer structure 108 and the plurality of color filter units 110. The lower electrode 112 and the upper electrode 124 (which will be described in detail later) can be connected to the power source 130. As mentioned previously, the power source 130 supplies voltage through the lower electrode 112 and the upper electrode 124, thereby generating the electric field on the surface of the dielectric layer 114. The lower electrode 112 may be formed by chemical vapor deposition (CVD), physical vapor deposition (PVD), high-density plasma chemical vapor deposition (HDP-CVD), plasma-enhanced chemical vapor deposition (PECVD), flowable chemical vapor deposition (FCVD), sub-atmospheric chemical vapor deposition (SACVD), sputtering, the like, or combinations thereof. Materials of the lower electrode 112 may include transparent conductive materials, such as amorphous silicon, polysilicon, poly-SiGe, metal nitride (such as titanium nitride (TiN), tantalum nitride (TaN), tungsten nitride (WN), titanium aluminum nitride (TiAlN), or the like), metal silicide (such as nickel silicide (NiSi), cobalt silicide (CoSi), tantalum silicon nitride (TaSiN), or the like), metal carbide (such as tantalum carbide (TaC), tantalum carbonitride (TaCN), or the like), metal oxide (such as magnesium oxide (MgO), zinc oxide (ZnO), aluminum-doped zinc oxide (AZO), gallium-doped zinc oxide (GZO), indium-doped zinc oxide (IZO), or the like), transparent organic conductive materials, and metals. Transparent organic conductive material may be selected from conductive polymers, such as thiophene-base conductive polymers, polyaniline, and polypyrrole. Metals may include, but not limited to, cobalt (Co), ruthenium (Ru), aluminum (Al), tungsten (W), copper (Cu), titanium (Ti), tantalum (Ta), silver (Ag), gold (Au), platinum (Pt), nickel (Ni), zinc (Zn), chromium (Cr), molybdenum (Mo), niobium (Nb), the like, combinations thereof, or the multiple layers thereof. The thickness of the lower electrode 112 may be between about 50 nm and 500 nm, for example, between about 100 nm and 200 nm.

Followed by deposition, the lower electrode 112 may be patterned using a photolithography and etching processes to create discontinuity within the film. The discontinuity may be a plurality of holes 112H (as shown in FIG. 1C). Since the plurality of holes 112H are empty spaces, which are, of course, non-conductive, the generated electric field is unable to extend to the plurality of holes 112H. When non-polar liquid 116 is being repelled by the electric field, it may be driven toward an isolated region on the dielectric layer 114 that corresponds to the plurality of holes 112H of the underlying lower electrode 112, which will be explained in reference with FIG. 2A.

Refer to FIG. 1A. The dielectric layer 114 is formed on the lower electrode 112. As stated above, the nature of the dielectric layer 114 may be interchanged between the hydrophobic state and the hydrophilic state, depending on the strength of the electric field being generated thereon. Under hydrophobic state, the dielectric layer 114 repels the polar liquid 120, allowing only a minimum (or none) contact area between the dielectric layer 114 and the polar liquid 120. Under hydrophilic state, the dielectric layer 114 attracts the polar liquid 120, such that a maximum contact area between the dielectric layer 114 and the polar liquid 120 may be observed. For example, the minimum contact area may be less than 50% of the available contact area, and the maximum contact area may be more than 50% of the available contact area. The dielectric layer 114 may be formed by chemical vapor deposition, high-density plasma chemical vapor deposition, plasma-enhanced chemical vapor deposition, flowable chemical vapor deposition, sub-atmospheric chemical vapor deposition, the like, or combinations thereof. Materials of the dielectric layer 114 may include transparent fluoropolymer, or the like. The thickness of the dielectric layer 114 may be between about 1 nm and 50 nm, for example, between about 5 nm and 10 nm.

Please refer to FIG. 1A. The pixel wall 122 may be vertically disposed on the dielectric layer 114. In some embodiments, the pixel wall 122 may be a partition member for dividing a containment space, which is sequentially defined between the dielectric layer 114 and the upper electrode 124. According to some embodiments of the present disclosure, the pixel wall 122 provides vertical support between the dielectric layer 114 and the upper electrode 124, thereby maintaining the space therebetween. Furthermore, the partition member of the pixel wall 122 separates the containment space into multiple units, which in turn realizing the fundamental structure for the plurality of liquid-lens units. In some embodiments, all features of the plurality of liquid-lens units may be transparent to enable light transmission. In other embodiments, the pixel wall 122 alone may be opaque, in order to eliminate cross talk between adjacent units. It should be appreciated that material of the pixel wall 122 needs to be insoluble in both the non-polar liquid 116 and the polar liquid 120, and does not undergo any chemical reactions with either the non-polar liquid 116 or the polar liquid 120. The formation of the pixel wall 122 may be similar to that of the spacer structure 108, and the details are not described again herein to avoid repetition. Exemplary materials of the pixel wall 122 may include polymeric materials, such as acrylic resins and epoxy resins. The width of the pixel wall 122 may be between about 10 nm and 1000 nm, for example, between about 50 nm and 100 nm. The height of the pixel wall 122 may be between about 500 nm and 3000 nm, for example, between about 1000 nm and 2000 nm.

According to some alternative embodiments of the present disclosure, the surface of the pixel wall 122 may be subjected to a hydrophilic treatment, in order to ensure compatibility with the polar liquid 120. The hydrophilic treatment may be performed by ultraviolet irradiation, oxygen plasma irradiation, laser irradiation, or the like.

Refer to FIG. 1A. The non-polar liquid 116 is retained with each of the plurality of liquid-lens units, which are divided by the pixel wall 122. Specifically, the pixel wall 122 prevents the non-polar liquid 116 within each unit to migrate (flowing out) to adjacent units. In each of the plurality of liquid-lens units, the non-polar liquid 116 should have sufficient amount present to cover the maximum contact area on the dielectric layer 114 for electrowetting, when no electric field is generated on the surface of the dielectric layer 114. In some embodiments, the non-polar liquid 116 contains a hydrophobic organic solvent as a medium. Exemplary hydrophobic organic solvents may include hydrocarbon having 6 to 35 carbon atoms, such as hexane, octane, decane, dodecane, hexadecane, undecane, benzene, toluene, xylene, mesitylene, butylbenzene, 1,1-diphenylethylene, silicone oil, the like, or combinations thereof. In general, the non-polar liquid 116 may be non-conductive, has a low viscosity, and may be immiscible with the polar liquid 120.

Please refer to FIG. 1A. Besides the non-polar liquid 116, the polar liquid 120 is also retained with each of the plurality of liquid-lens units, which are divided by the pixel wall 122. The non-polar liquid 116 and the polar liquid 120 are both disposed between the dielectric layer 114 and the upper electrode 124. As mentioned previously, the non-polar liquid 116 and the polar liquid 120 are separated elements, which are both confined within each of the plurality of liquid-lens units. In some embodiments, the non-polar liquid 116 and the polar liquid 120 are both movable fluid. The polar liquid 120 may include transparent materials having polarity.

Exemplary materials include water, alcohol, acids, and aqueous solutions containing an electrolyte (for example, potassium chloride (KCl), sodium chloride (NaCl), the like, or combinations thereof). According to some embodiments of the present disclosure, the refractive index of the non-polar liquid 116 is greater than the refractive index of the polar liquid 120, in order for incident light rays to be directed toward the non-polar liquid 116. When the dimensions of each of the plurality of liquid-lens units is small enough, such as between about 0.5 μm and 0.6 μm, gravity may have minimal effect on the non-polar liquid 116 and the polar liquid 120 within each unit.

Refer to FIG. 1A. The upper electrode 124 is formed on the pixel wall 122 and covers the non-polar liquid 116 and the polar liquid 120. In some embodiments, the upper electrode 124 confines the non-polar liquid 116 and the polar liquid 120 within each of the plurality of liquid-lens units, which is divided by the pixel wall 122. As mentioned previously, the lower electrode 112 and the upper electrode 124 are connected to the power source 130. The materials and the formation of the upper electrode 124 may be similar to those of the lower electrode 112, and the details are not described again herein to avoid repetition. The thickness of the upper electrode 124 may be between about 50 nm and 500 nm, for example, between about 100 nm and 200 nm. The upper electrode 124 may be patterned with respect to the lower electrode 112, but such patterning is optional. According to some embodiments of the present disclosure, the upper electrode 124 may remain as a continuous structure.

Please refer to FIG. 1A. The cover plate 126 is formed on the upper electrode 124. In some embodiments, the cover plate 126 may provide mechanical protection toward the underlying structure. In other embodiments, the cover plate 126 may also exert sufficient pressure or force to ensure that the underlying upper electrode 124 completely seals off each of the plurality of liquid-lens units. The cover plate 126 may be formed of, for example, a light-transmissive insulation material, such as glass or transparent resins. Exemplary transparent resins include polyethylene terephthalate (PET) resins, polycarbonate (PC) resins, polyimide (PI) resins, polymethylmethacrylates (PMMA), polystyrene resins, polyethersulfone (PES) resins, polythiophene (PT) resins, phenol novolac (PN), the like, or combinations thereof. In some embodiments, the cover plate 126 may be formed by any of the deposition methods described above, and the details are not described again herein to avoid repetition. The thickness of the cover plate 126 may be between about 1 μm and 50 μm, for example, between about 5 μm and 15 μm.

Refer to FIG. 1A. The power source 130 of the present disclosure may change the amount of voltage being supplied, and may also provide a constant voltage. In some embodiments, the power source 130 may apply a predetermined voltage across the lower electrode 112 and the upper electrode 124, such that each of the plurality of liquid-lens units may be applied upon. In the embodiment shown in FIG. 1A, the power source 130 may supply a voltage in a range between about 0V and 15V. Under such voltage range, no electric field, or a relatively weak electric field, is generated, and the dielectric layer 114 may remain in the hydrophobic state. As mentioned previously, the non-polar liquid 116 may cover the maximum contact area on the dielectric layer 114, while the polar liquid 120 may be repelled by the dielectric layer 114. It should be noted that the arrangement of the non-polar liquid 116 may appear similar to solid micro-lenses of a conventional image sensor. In the environment of high luminance, an image captured by the image sensor 10 under this voltage range may have displayed sufficient resolution. However, in the environment of low luminance, an image captured by the image sensor 10 under this voltage range may be too dark for viewing. Therefore, additional procedures may be required to address this issue.

Figure 1B:
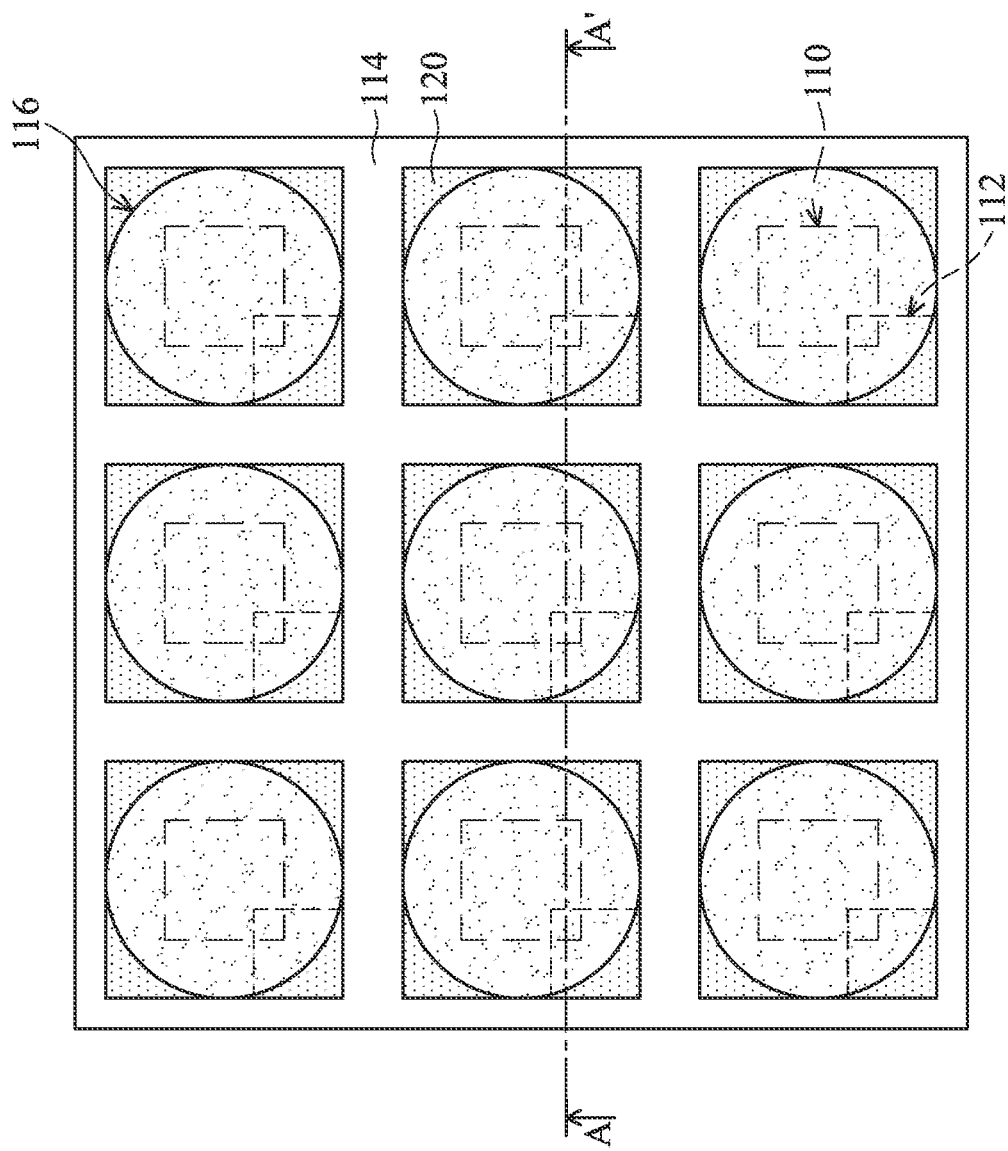
Figure 1C:
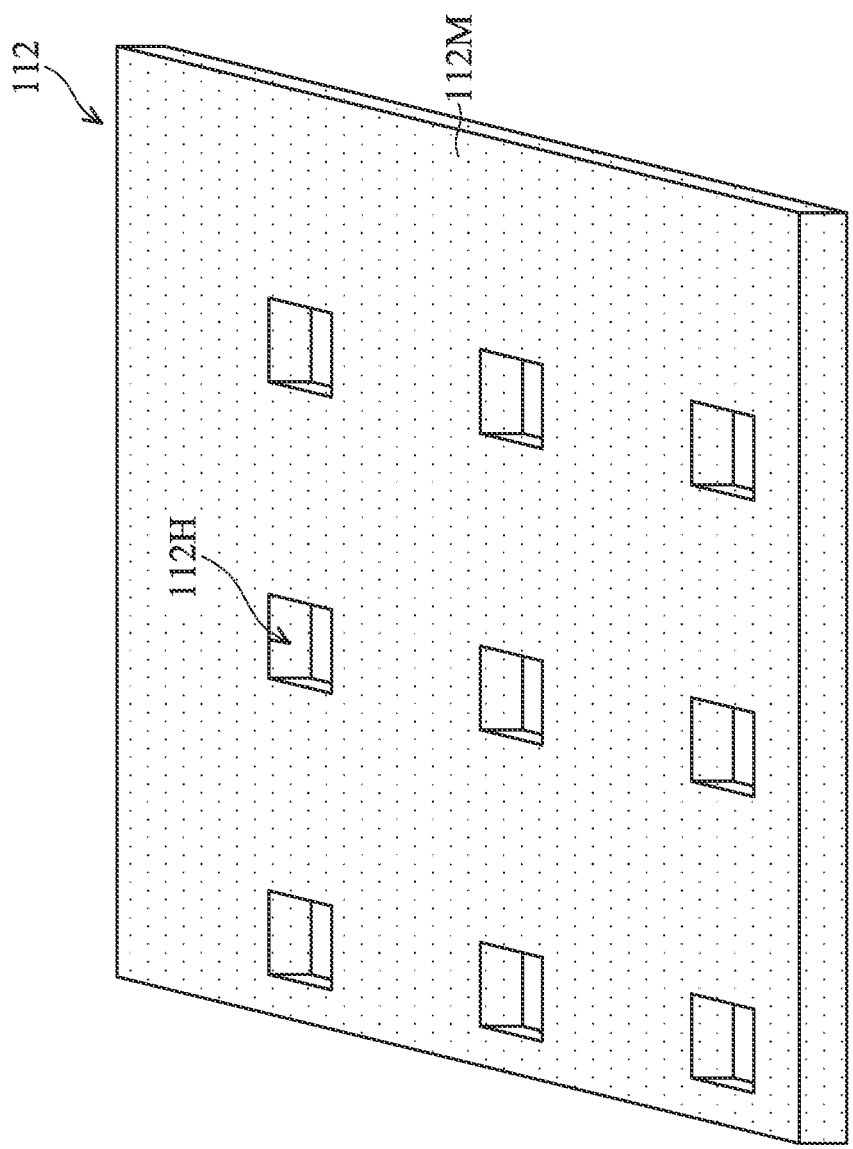
FIG. 1C is a 3D view of a portion of the image sensor, according to some embodiments of the present disclosure.

FIG. 1B is a top view of the image sensor 10 under the first operation state, according to some embodiments of the present disclosure. It should be noted that FIG. 1A is the cross-sectional view obtained from a line A-A' of FIG. 1B. In FIG. 1B, a portion of the plurality of liquid-lens units are illustrated. For illustrative purpose, the pixel wall 122, the upper electrode 124, and the cover plate 126 are omitted. In some embodiments, the plurality of liquid-lens units are compartmentalized by the grid structure of the pixel wall 122 (not shown for simplicity). As mentioned previously, the dielectric layer 114 may provide a contact surface for the non-polar liquid 116 and the polar liquid 120, which are immiscible with each other. According to some embodiments of the present disclosure, the dielectric layer 114 is disposed on the lower electrode 112, such that the lower electrode 112 is completely covered. Since it may be difficult to illustrate the entirety of the lower electrode 112 from top view, only the pattern of the plurality of holes 112H and its relative position are shown in dash lines. Furthermore, the plurality of color filter units 110 are disposed beneath the plurality of liquid-lens units, and the relative position of their patterns are also shown in dash lines. It should be noted that, under the first operation state, the non-polar liquid 116 may completely cover the plurality of color filter units 110. As mentioned previously, the structure shown in FIGS. 1A and 1B appears to be a conventional image sensor, which is efficient enough to operate in the environment of high luminance, but requires further procedure to operate in the environment of low luminance.

FIG. 1C is a 3D view of the lower electrode 112 of the image sensor 10, according to some embodiments of the present disclosure. As shown in FIG. 1C, the lower electrode 112 includes a film portion 112M and the plurality of holes 112H (as stated earlier). In some embodiments, the plurality of holes 112H completely penetrate through the lower electrode 112. In other words, only the film portion 112M of the lower electrode 112 may conduct electrical current for the electric field to be generated on the surface of the overlying dielectric layer 114, the plurality of holes 112H of the lower electrode 112 may not conduct current to generate such electric field. The plurality of holes 112H correspond to the plurality of liquid-lens units, respectively. Even though each of the plurality of holes 112H is illustrated as a square at the bottom left-hand corner of each corresponding liquid-lens unit, the present disclosure is not limited thereto. Furthermore, the plurality of holes 112H may have various shapes and dimensions that are different from each other, depending on the design requirement of the image sensor 10.

FIG. 2A is a cross-sectional view of the image sensor 10 under a second operation state, according to some embodiments of the present disclosure. In comparison with FIG. 1A, FIG. 2A illustrates the behavior of the image sensor 10 under the second operation state, when the power source 130 supplies a higher voltage. Under the second operation state, a voltage higher than, for example, 15V is applied by the power source 130. The features of the substrate 100, the plurality of sensing portions 102, the plurality of deep trench isolation structures 104, the anti-reflection layer 106, the spacer structure 108, the plurality of color filter units 110, and the plurality of liquid-lens units (such as the lower electrode 112, the dielectric layer 114, the non-polar liquid 116, the polar liquid 120, the pixel wall 122, the upper electrode 124, and the cover plate 126) are similar to those illustrated in FIG. 1A, and the details are not described again herein to avoid repetition. When the voltage supplied by the power source 130 has increased higher than 15V, a relatively strong electric field is generated on the surface of the dielectric layer 114. According to some embodiments of the present disclosure, this relatively strong electric field may gradually transform the dielectric layer 114 from the hydrophobic state to the hydrophilic state.

Please refer to FIG. 2A. Under increased voltage, the dielectric layer 114 begins to attract the polar liquid 120 and to repel the non-polar liquid 116. The repelled non-polar liquid 116 may be driven into the isolated region on the dielectric layer 114 with relatively weaker (or substantially no) electric field, namely the region corresponding to the plurality of holes 112H of the lower electrode 112. According to some embodiments of the present disclosure, the non-polar liquid 116 takes up more area on the dielectric layer 114 when less than 15V of voltage is applied than when more than 15V of voltage is applied. As shown in FIG. 2A, the plurality of color filter units 110 are substantially uncovered by the non-polar liquid 116. The configuration of FIG. 2A allows for an extremely large amount of incident light rays to enter the image sensor 10 without being converged through the plurality of liquid-lens units.

Figure 2B:
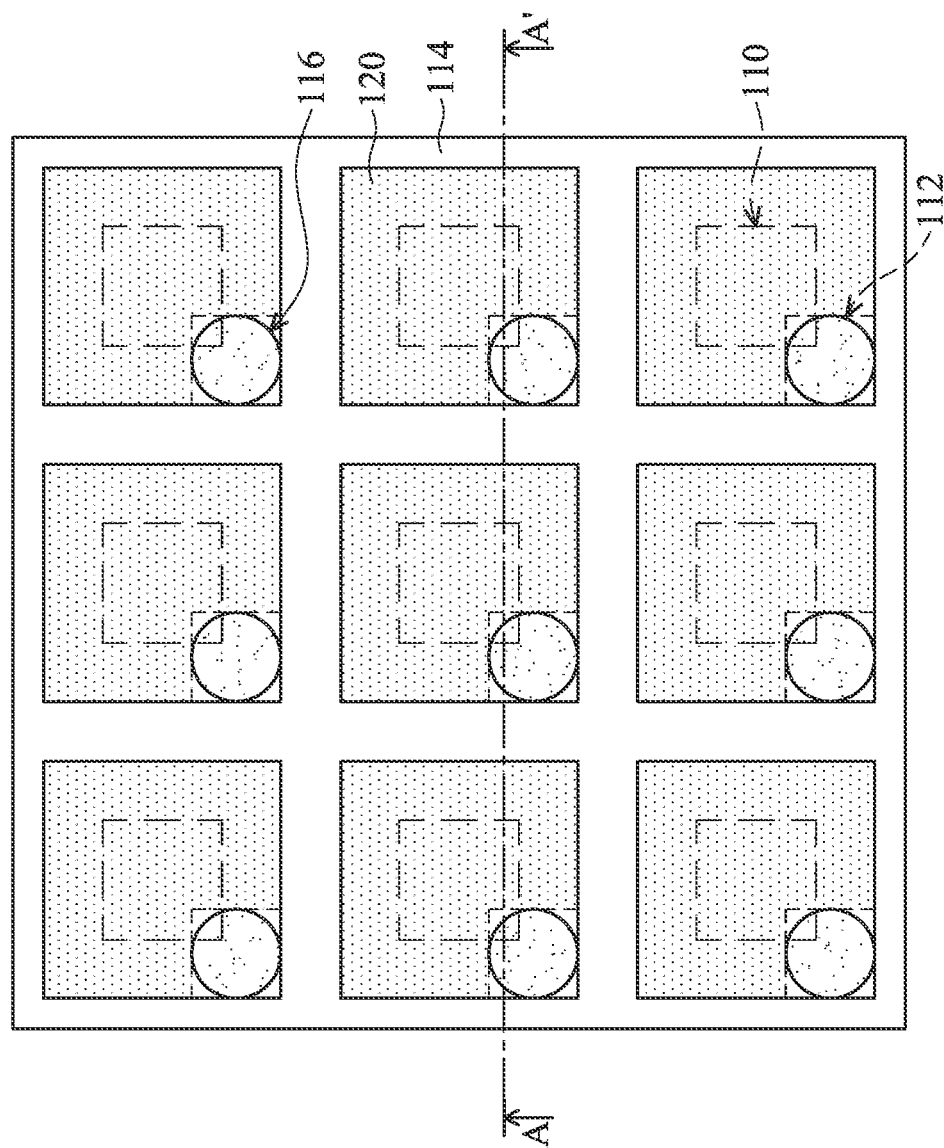

FIG. 2B is a top view of the image sensor 10 under the second operation state, according to some embodiments of the present disclosure. It should be noted that FIG. 2A is the cross-sectional view obtained from a line A-A' of FIG. 2B. In comparison with FIG. 1B, FIG. 2B illustrates the behavior of the image sensor 10 under the second operation state, when the power source 130 supplies a voltage higher than 15V. The features of the plurality of color filter units 110, the lower electrode 112, the dielectric layer 114, the non-polar liquid 116, and the polar liquid 120 are similar to those illustrated in FIG. 1B, and the details are not described again herein to avoid repetition. Due to the electric field generated on the surface of the dielectric layer 114, the non-polar liquid 116 is being repelled into the isolated region on the dielectric layer 114, which corresponds to the plurality of holes 112H of the underlying lower electrode 112. As mentioned previously, the non-polar liquid 116 takes up less area on the dielectric layer 114 when more than 15V of voltage is applied than when less than 15V of voltage is applied. In some embodiments, that smaller area corresponds to the plurality of holes 112H.

Figure 3:
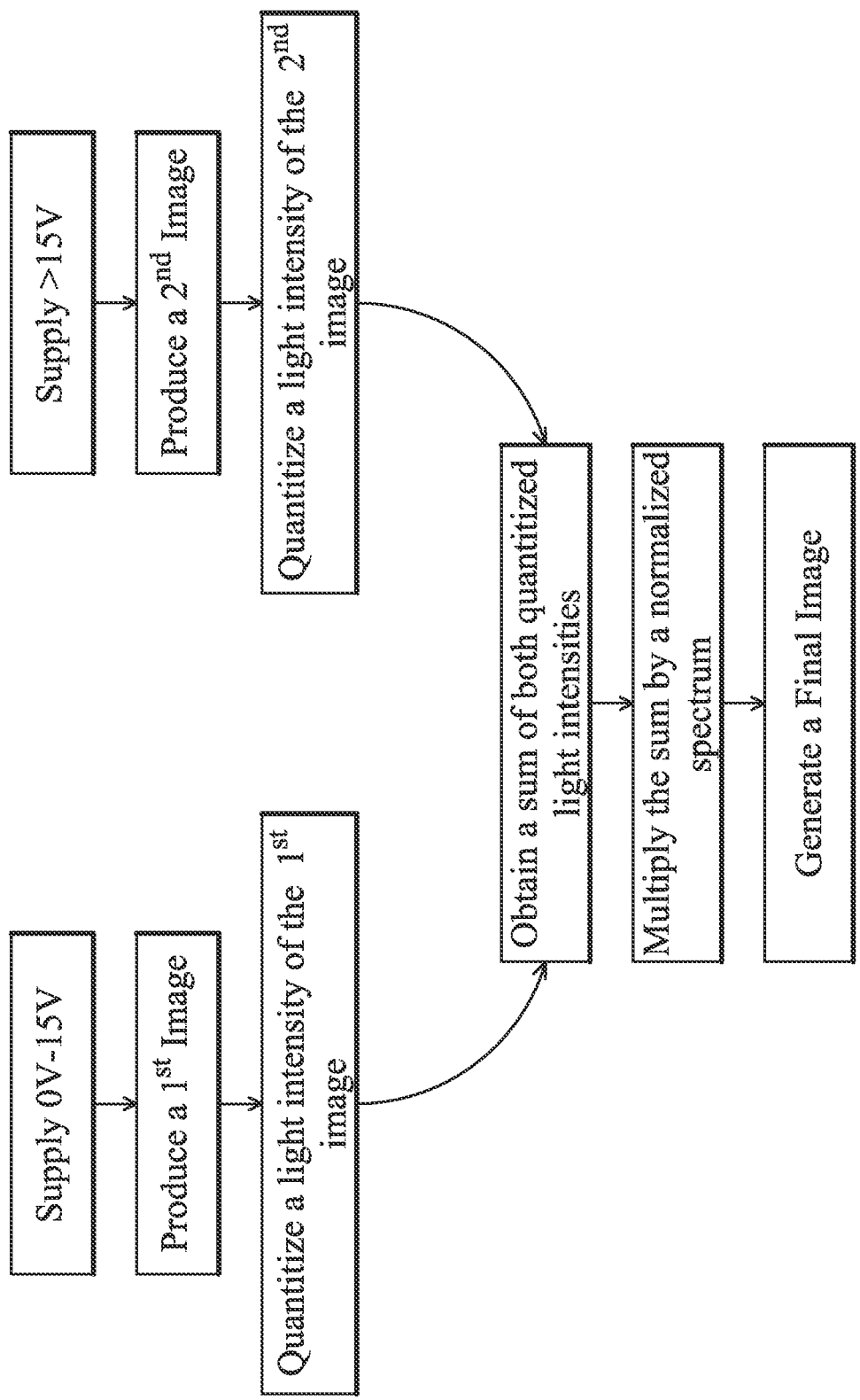
FIG. 3 is a flow chart of combining an image generated from the image sensor under the first operation state with an image generated from the image sensor under the second operation state.

FIG. 3 is a flow chart of combining a first image generated from the image sensor 10 under the first operation state with a second image generated from the image sensor 10 under the second operation state. An algorithm may be used to combine the first image under a voltage between about 0V and 15V and the second image under a voltage higher than 15V into a final image. The first image is colored with relatively low brightness, while the second image is black and white with relatively high contrast. In the algorithm, the quantitized light intensity of a single pixel from the first image is added with the quantitized light intensity of the same pixel from the second image. The sum of quantitized light intensities of the pixel from both images may then be multiplied by the normalized spectrum of the pixel to restore the original spectrum of the pixel. When every pixel from both images undergoes the procedure mentioned above, the final image may be generated. The final image produced by such algorithm will exhibit the same quality as an image taken by any conventional image sensor in the environment of high luminance. In other words, combining two images generated under different voltages in the environment of low luminance may realize the quality of the image taken in the environment of high luminance.

Figure 4A:
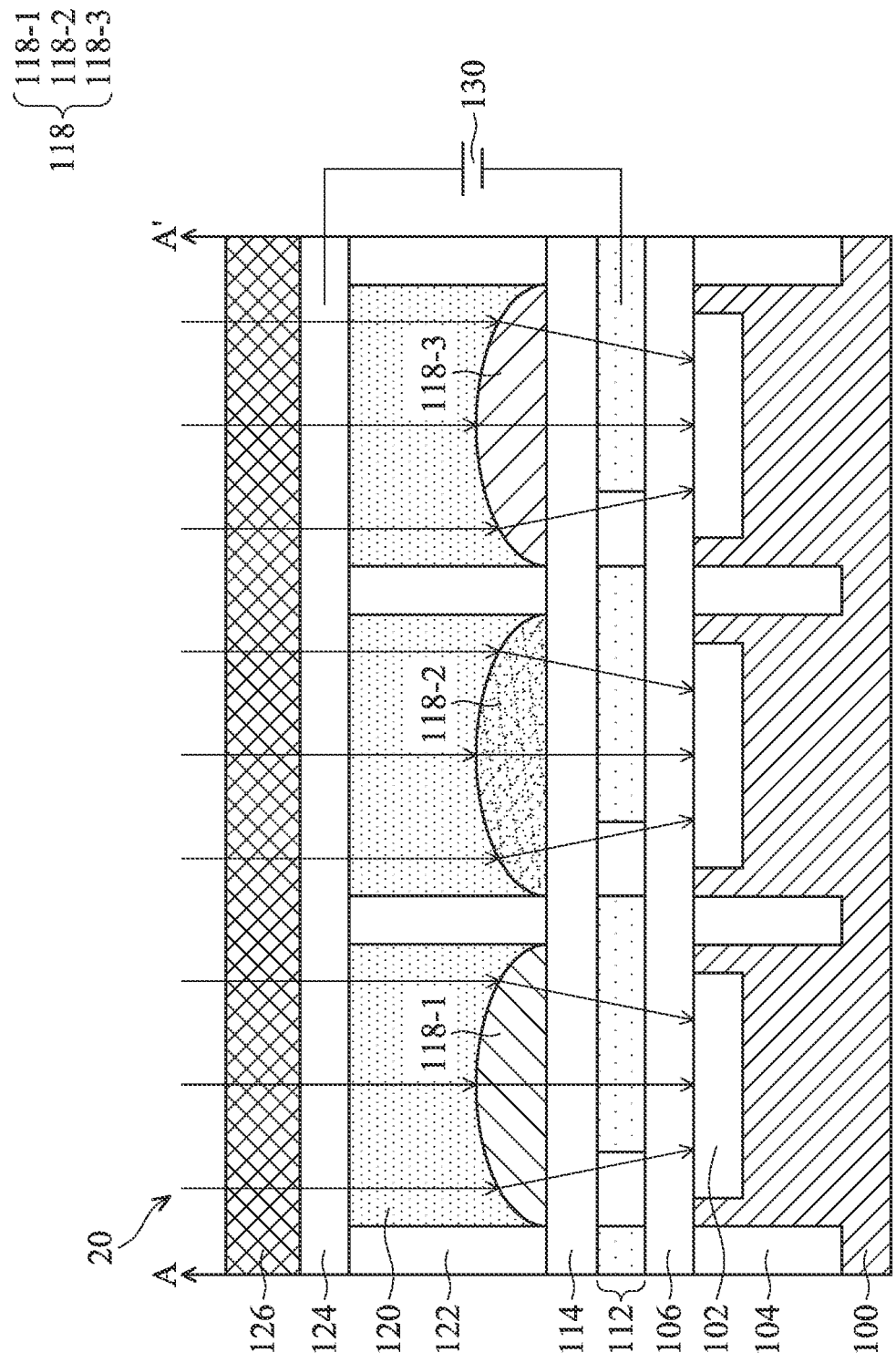
FIGS. 4A and 4B are respectively a cross-sectional view and a top view of an image sensor under the first operation state, according to other embodiments of the present disclosure.

FIG. 4A is a cross-sectional view of an image sensor 20 under the first operation state, according to other embodiments of the present disclosure. In comparison with the image sensor 10 in FIG. 1A, the image sensor 20 omits the spacer structure 108 and the plurality of color filter units 110. According to some embodiments of the present disclosure, the non-polar liquid 116 of the image sensor 10 may be injected with pigments to form non-polar liquid 118 in the image sensor 20. The non-polar liquid 118 further includes color liquid 118-1, color liquid 118-2, and color liquid 118-3. In some embodiments, the color liquid 118-1, the color liquid 118-2, and the color liquid 118-3 of the non-polar liquid 118 may function as the omitted plurality of color filter units 110, in addition of serving as micro-lenses. By exhibiting the traits of a color filter unit, the non-polar liquid 118 of the plurality of liquid-lens units may be disposed in such a way that they correspond with the plurality of sensing portions 102, respectively. The features of the substrate 100, the plurality of sensing portions 102, the plurality of deep trench isolation structures 104, the anti-reflection layer 106, and the plurality of liquid-lens units are similar to those illustrated in FIG. 1A, and the details are not described again herein to avoid repetition. In the present embodiment, the plurality of liquid-lens units of the image sensor 20 include the lower electrode 112, the dielectric layer 114, the non-polar liquid 118, the polar liquid 120, the pixel wall 122, the upper electrode 124, and the cover plate 126.

Please refer to FIG. 4A. The plurality of liquid-lens units are formed directly on the surface of the anti-reflection layer 106. As shown in FIG. 4A, the non-polar liquid 118 may completely cover the plurality of sensing portions 102, or more than 50% of the area of the plurality of sensing portions 102. In some embodiments, the color liquid 118-1, the color liquid 118-2, and the color liquid 118-3 of the non-polar liquid 118 may contain blue pigments, green pigments, and red pigments, respectively. In some embodiments, the non-polar liquid 118 of each of the plurality of liquid-lens units allows a predetermined range of wavelengths of light to pass through. For example, the color liquid 118-1 allows wavelengths of light in a range from 450 nm to 495 nm (blue light) to transmit to the corresponding sensing portion 102, the color liquid 118-2 allows wavelengths of light in a range from 495 nm to 570 nm (green light) to transmit to the corresponding sensing portion 102, and the color liquid 118-3 allows wavelengths of light in a range from 620 nm to 750 nm (red light) to transmit to the corresponding sensing portion 102. The refractive index of the non-polar liquid 118 is greater than the refractive index of the polar liquid 120.

Refer to FIG. 4A. Similar to the image sensor 10 of FIG. 1A, the image sensor 20 is under the first operation state, when the power source 130 may supply a voltage in a range between about 0V and 15V. Under such voltage range, no electric field, or a relatively weak electric field, is generated, and the dielectric layer 114 may remain in hydrophobic state. As mentioned previously, the non-polar liquid 118 may cover more than 50% of the area of the plurality of sensing portions 102, while the polar liquid 120 may be repelled by the dielectric layer 114. It should be noted that the arrangement of the non-polar liquid 118 may appear similar to solid micro-lenses of a conventional image sensor. In the environment of high luminance, an image captured by the image sensor 20 under this voltage range may have displayed sufficient resolution. However, in the environment of low luminance, an image captured by the image sensor 20 under this voltage range may be too dark for viewing. Therefore, additional procedures may be required to address this issue.

Figure 4B:
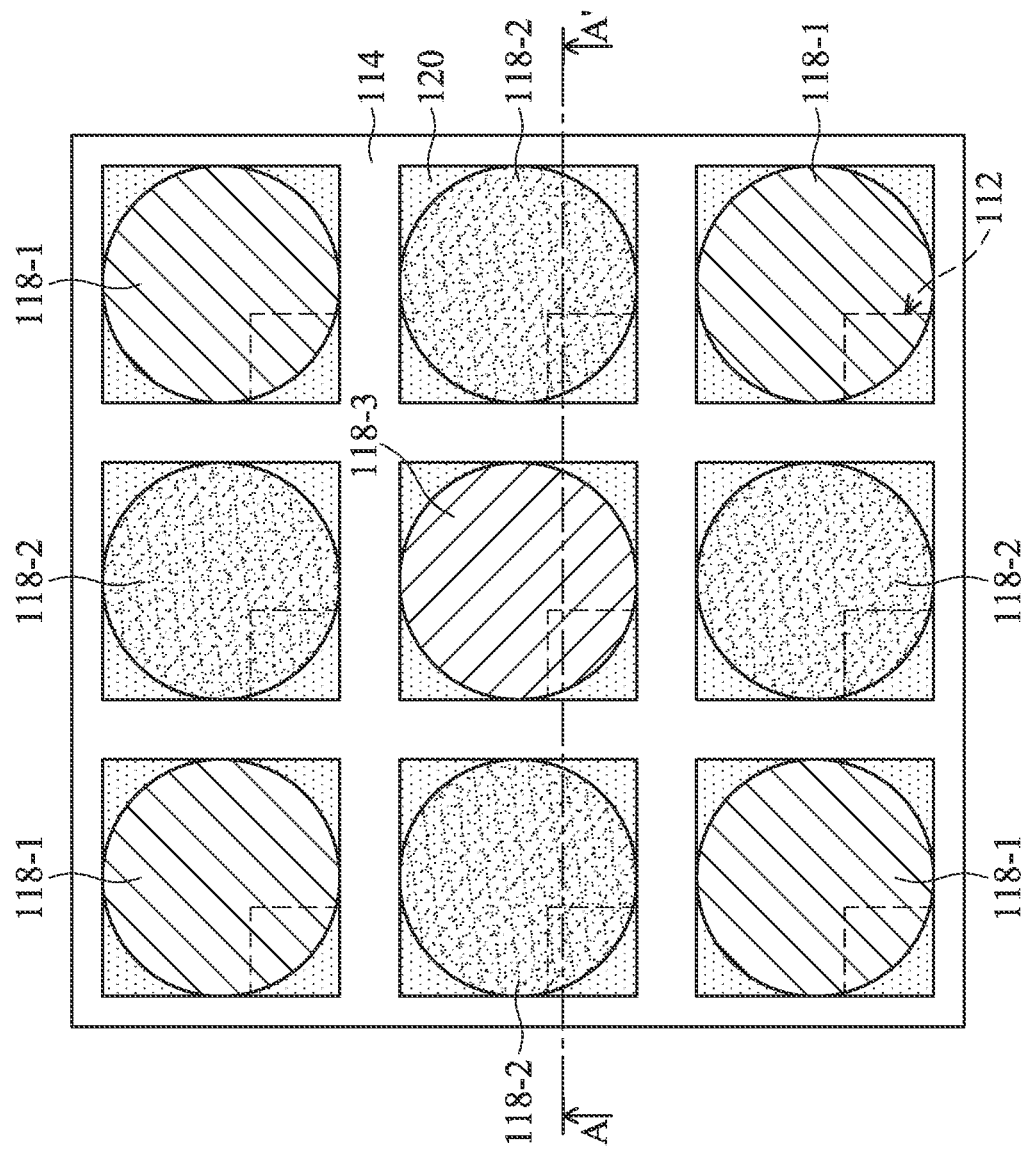

FIG. 4B is a top view of the image sensor 20 under the first operation state, according to other embodiments of the present disclosure. It should be noted that FIG. 4A is the cross-sectional view obtained from a line A-A' of FIG. 4B. In FIG. 4B, a portion of the plurality of liquid-lens units are illustrated. For illustrative purpose, the pixel wall 122, the upper electrode 124, and the cover plate 126 are omitted. In some embodiments, the plurality of liquid-lens units are compartmentalized by the grid structure of the pixel wall 122 (not shown for simplicity). As mentioned previously, the dielectric layer 114 may provide a contact surface for the non-polar liquid 118 (containing the color liquid 118-1, the color liquid 118-2, and the color liquid 118-3) and the polar liquid 120, which are immiscible with each other. According to some embodiments of the present disclosure, the dielectric layer 114 is disposed on the lower electrode 112, such that the lower electrode 112 is completely covered. The pattern of the lower electrode 112 and its relative position are shown in dash lines. It should be noted that, under the first operation state, the non-polar liquid 118 may cover more than 50% of the area of the plurality of sensing portions 102 (not shown). As mentioned previously, the structure shown in FIGS. 4A and 4B is efficient enough to operate in the environment of high luminance, but requires further procedure to operate in the environment of low luminance.

Figure 5A:
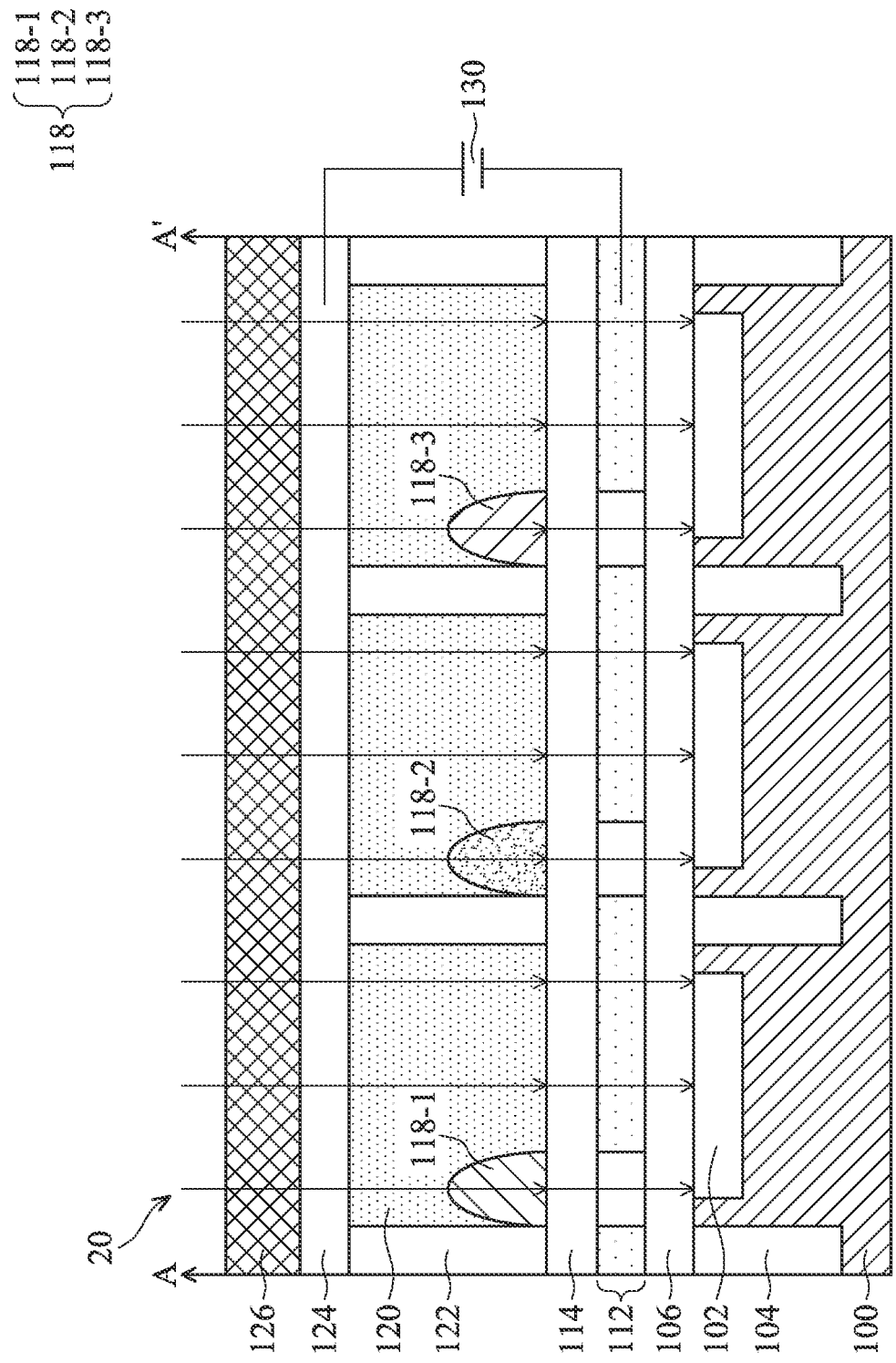
FIGS. 5A and 5B are respectively a cross-sectional view and a top view of the image sensor under the second operation state, according to other embodiments of the present disclosure.

FIG. 5A is a cross-sectional view of the image sensor 20 under the second operation state, according to other embodiments of the present disclosure. In comparison with FIG. 4A, FIG. 5A illustrates the behavior of the image sensor 20 under the second operation state, when the power source 130 supplies a voltage higher than 15V. The features of the substrate 100, the plurality of sensing portions 102, the plurality of deep trench isolation structures 104, the anti-reflection layer 106, and the plurality of liquid-lens units (such as the lower electrode 112, the dielectric layer 114, the non-polar liquid 118, the polar liquid 120, the pixel wall 122, the upper electrode 124, and the cover plate 126) are similar to those illustrated in FIG. 4A, and the details are not described again herein to avoid repetition. When the voltage supplied by the power source 130 has increased higher than 15V, a relatively strong electric field is generated on the surface of the dielectric layer 114. According to some embodiments of the present disclosure, this relatively strong electric field may gradually transform the dielectric layer 114 from the hydrophobic state to the hydrophilic state.

Please refer to FIG. 5A. Under increased voltage, the dielectric layer 114 begins to attract the polar liquid 120 and to repel the non-polar liquid 118 (including the color liquid 118-1, the color liquid 118-2, and the color liquid 118-3). The repelled non-polar liquid 118 may be driven into the isolated region on the dielectric layer 114 with relatively weaker (or substantially no) electric field, namely the region corresponding to the plurality of holes 112H of the underlying lower electrode 112. According to some embodiments of the present disclosure, the non-polar liquid 118 takes up more area on the dielectric layer 114 when less than 15V of voltage is applied than when more than 15V is applied. As shown in FIG. 5A, the non-polar liquid 118 may cover less than 50% of the area of the plurality of sensing portions 102. The configuration of FIG. 5A allows for an extremely large amount of incident light to enter the image sensor 20 without being converged through the plurality of liquid-lens units.

Figure 5B:
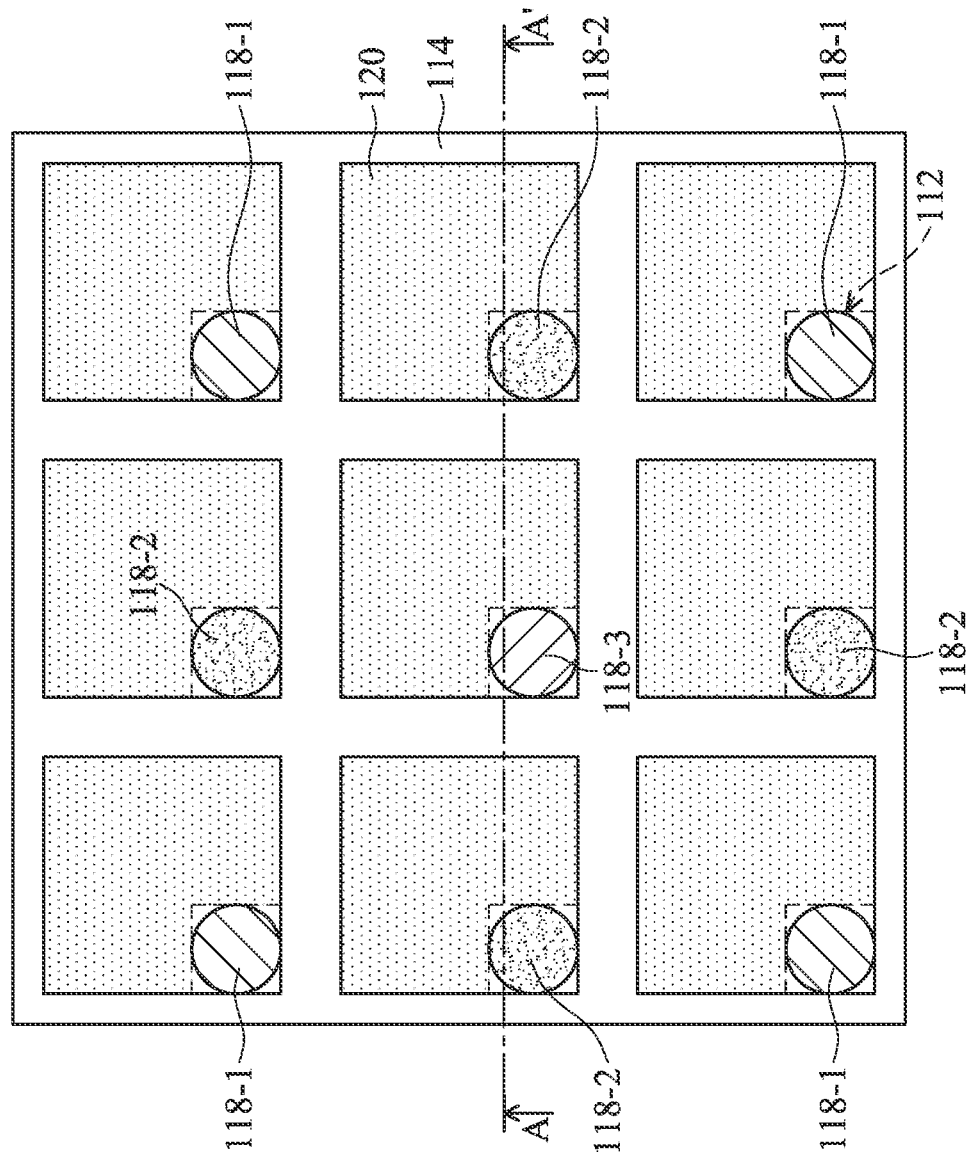

FIG. 5B is a top view of the image sensor 20 under the second operation state, according to other embodiments of the present disclosure. It should be noted that FIG. 5A is the cross-sectional view obtained from a line A-A' of FIG. 5B. In comparison with FIG. 4B, FIG. 5B illustrates the behavior of the image sensor 20 under the second operation state, when the power source 130 supplies a voltage higher than 15V. The features of the lower electrode 112, the dielectric layer 114, the non-polar liquid 118 (containing the color liquid 118-1, the color liquid 118-2, and the color liquid 118-3), and the polar liquid 120 are similar to those illustrated in FIG. 4B, and the details are not described again herein to avoid repetition. Due to the electric field generated on the surface of the dielectric layer 114, the non-polar liquid 118 is being repelled into the isolated region on the dielectric layer 114, which corresponds to the plurality of holes 112H of the underlying lower electrode 112. As mentioned previously, the non-polar liquid 118 takes up less area on the dielectric layer 114 when more than 15V of voltage is applied than when less than 15V of voltage is applied. In some embodiments, that smaller area corresponds to the plurality of holes 112H.

In the environment of low luminance, the image generated under the voltage between about 0V and 15V is colored with relatively low brightness, while the image generated under the voltage higher than 15V is black and white with relatively high contrast. The inventor employs the same algorithm described in FIG. 3 to combine the colored image and the black and white image into a final image. Similar to the image sensor 10, the final image of the image sensor 20 will exhibit the same quality as an image taken by any conventional image sensor in the environment of high luminance. In other words, combining two images under different voltages in the environment of low luminance may realize the quality of the image taken in the environment of high luminance.

In the environment of low luminance, both the image sensor 10 and the image sensor 20 may generate and combine two images taken with different voltage levels. The final image produced by either the image sensor 10 or the image sensor 20 has the same quality as an image taken by a conventional image sensor in the environment of high luminance. The image sensor 20 integrates the plurality of color filter units into the plurality of liquid-lens units, such that the overall structure may be simplified, leading to lower manufacturing cost. Nevertheless, even though the non-polar liquid itself is transparent, the non-polar liquid being injected with pigments may still display a slight color variation from the plurality of color filter units 110 due to different refraction and wavelength of the liquid chemicals. Depending on the design or application requirements, any of the two image sensor structures may be selected to produce high quality images in the environment of low luminance.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A method for detecting images from an image sensor, comprising:
   providing the image sensor having a plurality of liquid-lens units, comprising:
      a lower electrode and an upper electrode;
      a dielectric layer disposed between the lower electrode and the upper electrode;
      a containment space disposed between the dielectric layer and the upper electrode; and
      a non-polar liquid and a polar liquid filled into the containment space, wherein the non-polar liquid and the polar liquid are immiscible with each other, wherein the non- polar liquid is configured to occupy a first contact area on the dielectric layer under a first voltage, and a second contact area on the dielectric layer under a second voltage, wherein the first contact area is larger than the second contact area, and the second voltage is higher than the first voltage;
   connecting the lower electrode and the upper electrode to a power source;
   supplying the first voltage from the power source to the image sensor through the lower electrode and the upper electrode to generate a first image;
   supplying the second voltage from the power source to the image sensor through the lower electrode and the upper electrode to generate a second image; and
   combining the first image and the second image into a final image using an algorithm,
   wherein the first image is colored and the second image is black and white, wherein the algorithm multiplies a sum of a light intensity of the first image and a light intensity of the second image by a normalized spectrum to generate the final image.

2. The method of claim 1, further comprising patterning the lower electrode to have a plurality of holes, while the upper electrode is formed as a continuous structure.

3. The method of claim 2, wherein the second contact area on the dielectric layer corresponds to the plurality of holes.

4. The method of claim 3, wherein the second contact area is located far away from a center point of each of the plurality of liquid-lens units from a top view.

5. The method of claim 1, wherein the image sensor further comprising a pixel wall to vertically support the dielectric layer and the upper electrode, wherein the pixel wall compartmentalizes the containment space into the plurality of liquid-lens units.

6. The method of claim 1, wherein the image sensor further comprising:
   a plurality of sensing portions; and
   a plurality of color filter units disposed correspondingly and respectively above the plurality of sensing portions and below the plurality of liquid-lens units.

7. The method of claim 6, wherein a spacer structure surrounds each of the plurality of color filter units.

8. The method of claim 6, wherein the plurality of color filter units are entirely covered by the non-polar liquid when the non-polar liquid is configured to occupy the first contact area on the dielectric layer under the first voltage.

9. The method of claim 6, wherein the plurality of color filter units are uncovered by the non-polar liquid when the non-polar liquid is configured to occupy the second contact area on the dielectric layer under the second voltage.

10. The method of claim 6, wherein the non-polar liquid contains pigments and acts as a color filter unit.

11. The method of claim 10, wherein the non-polar liquid having the pigments occupies more than 50% of an area of the plurality of sensing portions.

12. The method of claim 10, wherein the non-polar liquid having the pigments occupies less than 50% of an area of the plurality of sensing portions.

13. The method of claim 6, wherein the image sensor further comprising a plurality of deep trench isolation (DTI) structures separating the plurality of sensing portions.

14. The method of claim 13, wherein the plurality of deep trench isolation structures define a size of a sensor unit.

15. The method of claim 1, wherein the dielectric layer is formed of hydrophobic materials.

16. The method of claim 15, wherein the dielectric layer is hydrophobic under the first voltage, and hydrophilic under the second voltage.

17. The method of claim 1, wherein a refractive index of the non-polar liquid is greater than a refractive index of the polar liquid.

18. The method of claim 1, wherein a cover plate is disposed on the upper electrode.

* * * * *